(12) United States Patent
Fujita et al.

(10) Patent No.: US 7,462,569 B2
(45) Date of Patent: Dec. 9, 2008

(54) METHOD OF MANUFACTURING SEMICONDUCTOR DEVICE

(75) Inventors: Keiji Fujita, Oita (JP); Hideshi Miyajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 11/508,230

(22) Filed: Aug. 23, 2006

(65) Prior Publication Data

US 2008/0216746 A1    Sep. 11, 2008

(30) Foreign Application Priority Data

Aug. 24, 2005   (JP)   .............. 2005-243086

(51) Int. Cl.
*H01L 21/31*   (2006.01)
*H01L 21/00*   (2006.01)
*B08B 6/00*    (2006.01)
*B05C 5/02*    (2006.01)
*H05H 1/24*    (2006.01)
*C23C 8/00*    (2006.01)

(52) U.S. Cl. .................. 438/778; 438/795; 134/1.1; 118/624; 427/578; 427/588

(58) Field of Classification Search ................ 438/778, 438/795; 134/1.1; 118/624; 427/578, 588
See application file for complete search history.

(56) References Cited

U.S. PATENT DOCUMENTS

| 6,164,295 | A | 12/2000 | Ui et al. |
| 6,703,302 | B2 | 3/2004 | Miyajima et al. |
| 7,256,139 | B2 * | 8/2007 | Moghadam et al. ......... 438/758 |
| 2003/0143847 | A1 | 7/2003 | Miyajima et al. |
| 2004/0137760 | A1 | 7/2004 | Onishi et al. |
| 2005/0250311 | A1 | 11/2005 | Miyajima et al. |

FOREIGN PATENT DOCUMENTS

| JP | 2002-353212 | 12/2002 |
| JP | 2004-253749 | 9/2004 |

* cited by examiner

*Primary Examiner*—Long K Tran
(74) *Attorney, Agent, or Firm*—Finnegan, Henderson, Farabow, Garrett & Dunner, L.L.P.

(57) ABSTRACT

A method of manufacturing a semiconductor device bakes a first semiconductor substrate on which a sacrifice film is formed in a reaction chamber to preliminarily coat an inner wall of the reaction chamber with a component of a gas generated by the sacrifice film, and bakes a second semiconductor substrate on which a predetermined film including the same component as that of the sacrifice film is formed in the preliminarily coated reaction chamber, while irradiating electron beams on the predetermined film to change quality of the predetermined film.

20 Claims, 6 Drawing Sheets

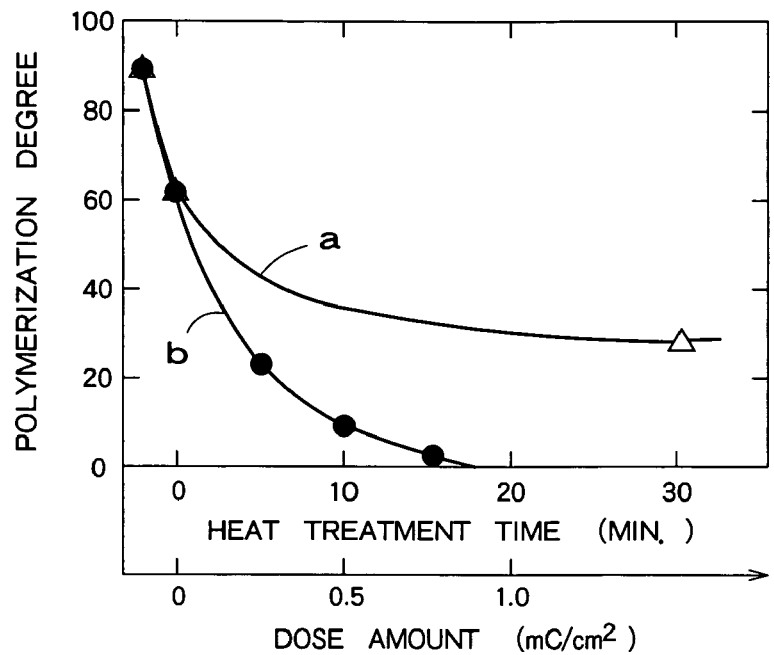
F I G. 2
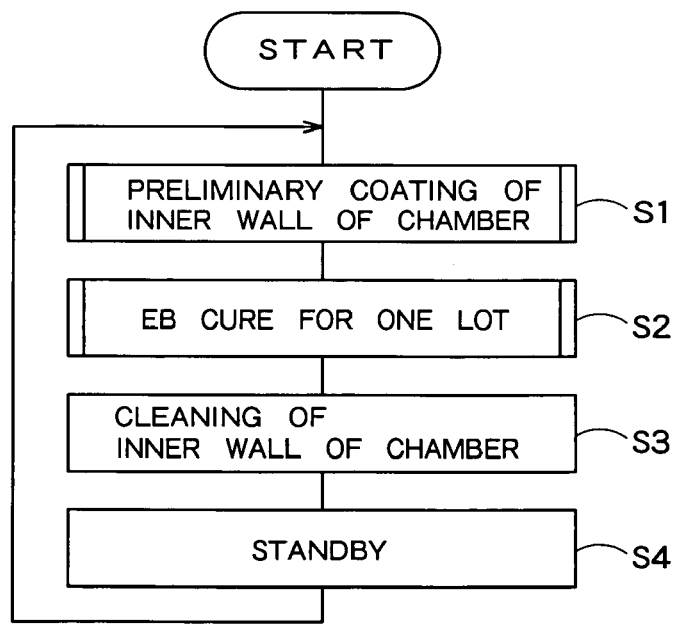
F I G. 3

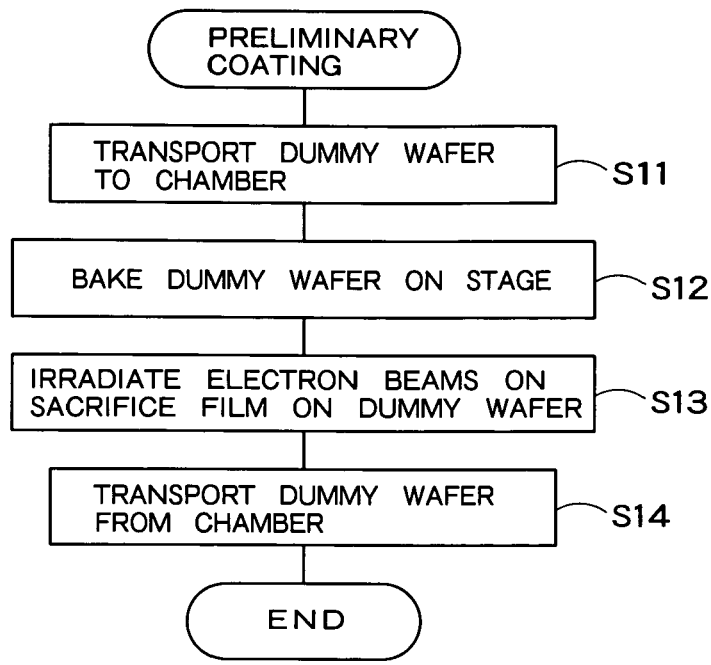
F I G. 4
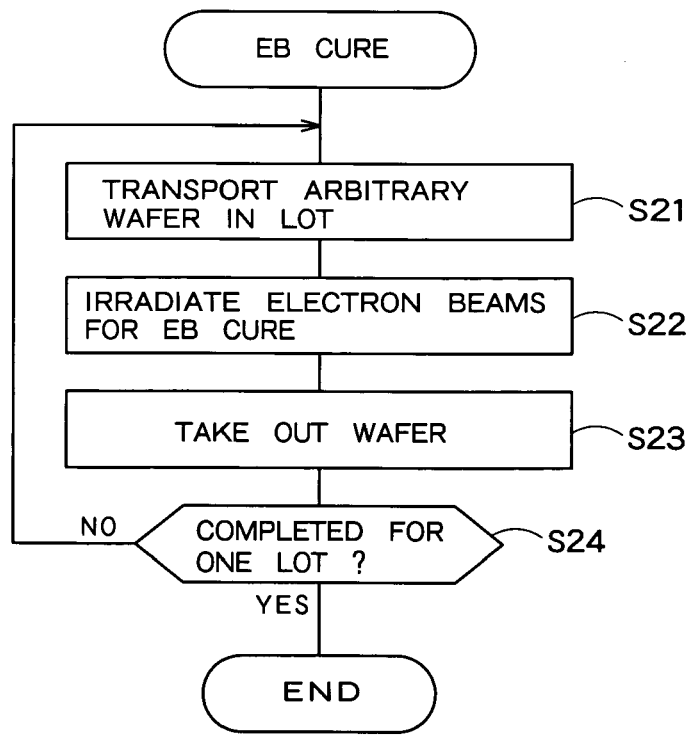
F I G. 5

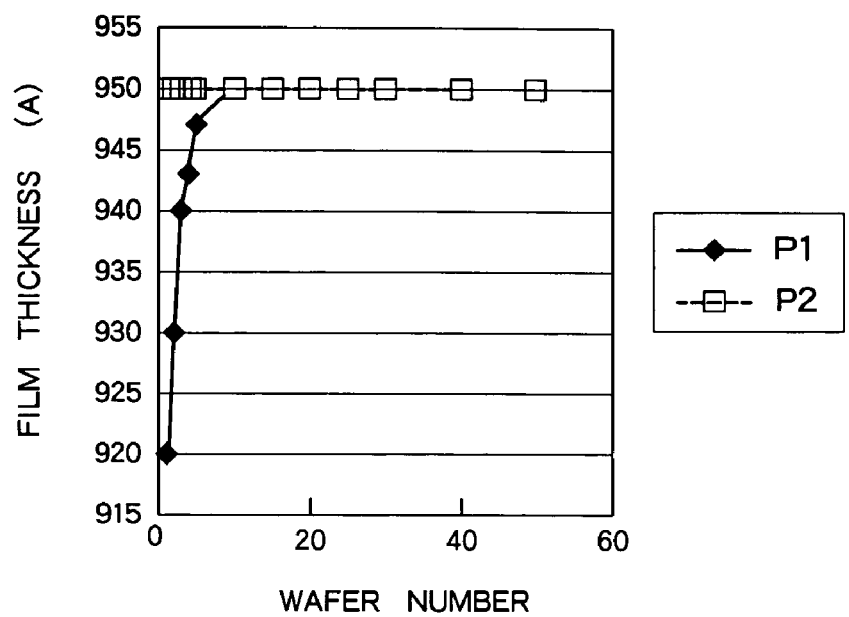
F I G. 6
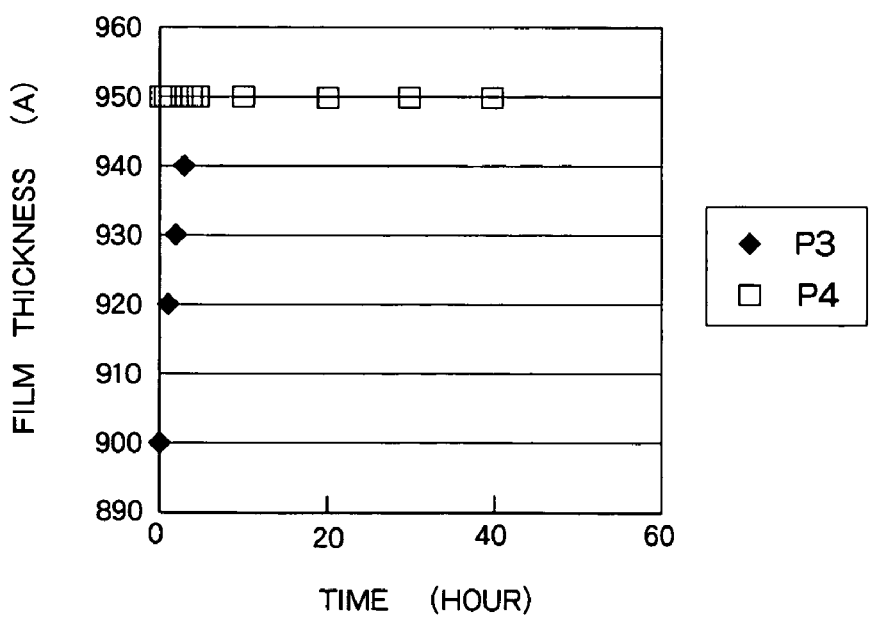
F I G. 7

METHOD OF MANUFACTURING SEMICONDUCTOR DEVICE

CROSS REFERENCE TO RELATED APPLICATIONS

This application is based upon and claims the benefit of priority from the prior Japanese Patent Application No. 2005-243086, filed on Aug. 24, 2005, the entire contents of which are incorporated herein by reference.

BACKGROUND OF THE INVENTION

1. Field of the Invention

The present invention relates to a semiconductor device manufacturing method in which quality of a film on a semiconductor substrate is improved by irradiating electron beams onto the film.

2. Related Art

In general, in a low-dielectric-constant insulating film (referred to as a Spin On Dielectric film, hereinafter) coated on a wafer, a polymerization reaction or a cross-linking reaction is generated normally by heat treatment so as to obtain a desired film structure. It is known that, by performing the heat treatment, the reaction is facilitated, whereby enhancement of the insulating performance of an insulating film, reduction of the dielectric constant, and enlargement of the mechanical strength can be achieved.

By not only performing the heat treatment but also using electron beams, it is possible to obtain an insulating film having a film structure which is formed at low temperature and at a short time, and is not available by heat treatment only. More specifically, without raising the dielectric constant of the insulating film, mechanical strength and adhesiveness of a film interface can be enhanced through electron-beam irradiation (refer to, e.g., Japanese Patent Laid-Open Pubs. No. 2002-353212 and No. 2004-253749).

In general, in irradiating electron beams, in order to reduce electron loss in the space between an electron emitting surface of an electron gun and a substrate surface of a target wafer and to control the energy of electrons, the wafer is placed within a vacuum chamber to be processed.

SUMMARY OF THE INVENTION

According to one embodiment of the present invention, there is provided a method of manufacturing a semiconductor device, comprising:

baking a first semiconductor substrate on which a sacrifice film is formed in a reaction chamber to preliminarily coat an inner wall of the reaction chamber with a component of a gas generated by the sacrifice film; and baking a second semiconductor substrate on which a predetermined film including the same component as that of the sacrifice film is formed in the preliminarily coated reaction chamber, while irradiating electron beams on the predetermined film to change quality of the predetermined film.

BRIEF DESCRIPTION OF THE DRAWINGS

FIG. 2 is a graph comparing the degree of polymerization through temperature with the degree of polymerization through electron-beam irradiation in terms of a polyarylene.

FIG. 3 is a process flowchart illustrating a semiconductor device manufacturing process according to Embodiment 1 of the present invention.

FIG. 4 is a flowchart illustrating a detailed procedure for the preliminary coating processing.

FIG. 5 is a flowchart illustrating a detailed procedure for EB cure processing.

FIG. 6 is a graph representing a relationship between the number of processed wafers 1 and the film thickness after the EB cure, in the case where the inner wall of the chamber 4 is preliminarily coated and in the case where the inner wall of the chamber 4 is not preliminarily coated.

FIG. 7 is a graph representing a relationship between the elapsed time after the chamber 4 is released in the atmospheric air and the film thickness after the EB cure in the case where the inner wall of the chamber 4 is preliminarily coated after the chamber 4 is released in the atmospheric air, and then the chamber 4 is set again to the vacuum state, and in the case where the inner wall of the chamber 4 is not preliminarily coated.

DETAILED DESCRIPTION OF THE INVENTION

Embodiments of the present invention will be explained below with reference to the accompanying drawings.

Embodiment 1

Figure 1:
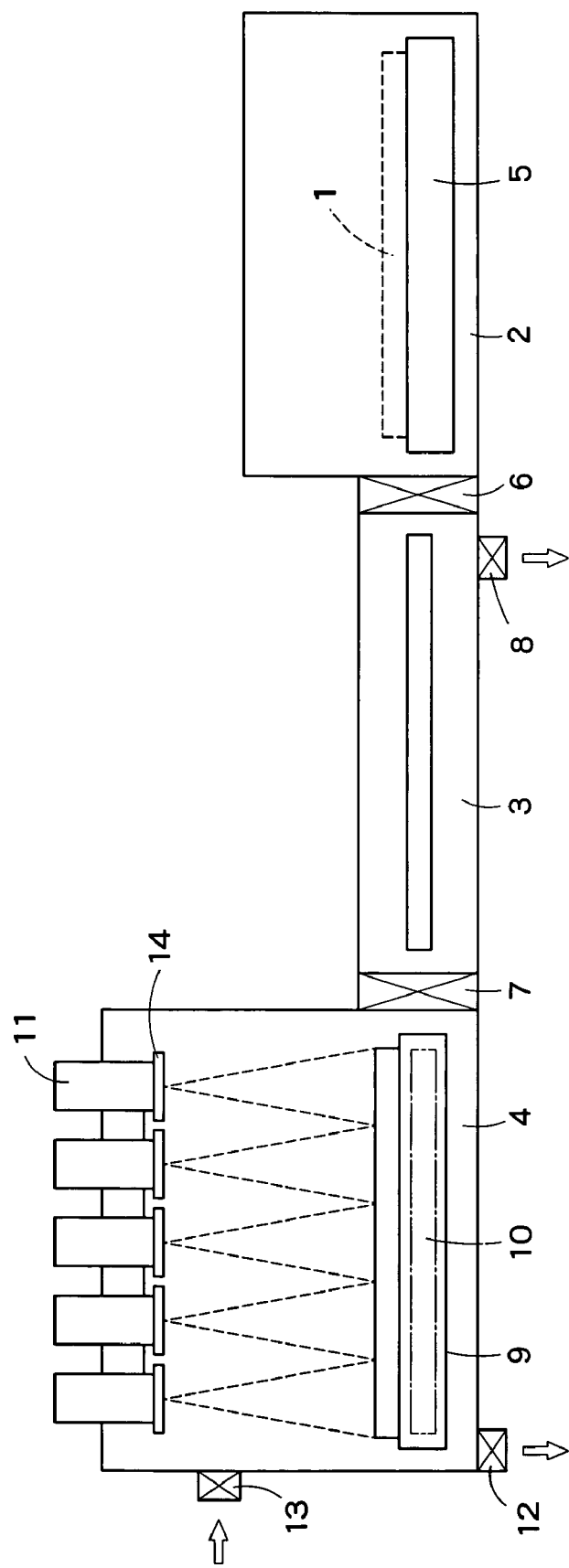
FIG. 1 is a schematic block diagram illustrating a semiconductor manufacturing apparatus for performing a semiconductor device manufacturing method according to an embodiment of the present invention.

FIG. 1 is a diagram showing schematic configuration of a semiconductor manufacturing apparatus for implementing a method of manufacturing a semiconductor device according to an embodiment of the present invention. The semiconductor manufacturing apparatus in FIG. 1 is provided with a chamber 2 in which a specific film is formed on a wafer 1, a transport room 3 in which the wafer 1 is transported, and a chamber 4 in which electron beams are irradiated onto the wafer 1 on which the specific film is formed.

A plurality of wafers 1 are transported to the transport room 3 for each lot, and each wafer 1 in the lot is transported in turn to the chamber 2. In the chamber 2, the specific film is formed on the wafer 1, through a so-called spin-on method in which, while the wafer 1 is placed on a rotatable stage 5 and rotated, a predetermined liquid-state substance is dripped onto the wafer 1. The wafer 1 on which such a film has been formed is transported again to the transport room 3. The processing within the chamber 2 is performed under atmospheric pressure.

After film formation is completed within the chamber 2 on all the wafers 1 for one lot, a gate valve 6 located between the transport room 3 and the chamber 2 and a gate valve 7 located between the chamber 4 and the transport room 3 are closed, and the air in the transport room 3 is discharged through an air discharge valve 8, whereby the transport room 3 is set to a vacuum state. Here, it is assumed that inside of the chamber 4 is preliminarily set to the vacuum state.

When the vacuum level of the transport room 3 becomes the same as that of the chamber 4, the gate valve 7 is opened to transport the wafer 1 from the transport room 3 to the chamber 4. The chamber 4 is provided with a stage 9 on which the wafer 1 can be placed, a heater 10 that is incorporated in the stage 9 and heats the wafer 1, a plurality of EB (Electron Beam) tubes 11 through which electron beams are irradiated onto the wafer 1, an air discharge valve 12 through which the air inside the chamber 4 is discharged, and a gas introduction valve 13 through which a specific gas is sent into the chamber 4.

By providing the plurality of EB tubes 11, electron beams can evenly be irradiated onto the wafer 1. A thin film portion 14 is provided at the bottom end of each EB tube 11. The thin film portion 14, which has an electron-beam irradiation opening, maintains the internal space of the EB tube 11 more vacuum than that of the chamber 4 and prevents substances in the chamber 4 from attaching to a filament (unillustrated) inside the EB tube 11.

In Embodiment 1, it is assumed that a film causing a polymerization reaction with electron-beam irradiation is formed on the wafer 1. For example, a polyarylene (PAr) organic film, which is a kind of low-dielectric-constant insulating film (SOD film) formed with the spin-on method, can be accelerated by electron-beam irradiation, can accelerate the polymerization reaction by electron-beam irradiation. FIG. 2 is a graph comparing the degree of polymerization through temperature (curve "a") with the degree of polymerization through electron-beam irradiation (curve "b") in terms of a polyarylene. FIG. 2, the abscissa for the curve "a" denotes the heat treatment time and the abscissa for the curve "b" denotes the irradiation dose of an electron beam (EB dose). The ordinates for both the curves denote the degree of polymerization. As can be seen from FIG. 2, the electron-beam irradiation accelerates the degree of polymerization more efficiently than the heat treatment does.

When the electron-beam is irradiated, without increasing the dielectric constant, it is possible to improve the film quality such as the mechanical strength or the adhesiveness of the interface between the film and the wafer 1.

Here, during the irradiation of electron beams, energized electrons excite a gas existing within the chamber, whereby plasma is generated within the chamber. Due to the plasma, a SOD film is sputtered or etched, whereby the film thickness may deviate from the desired one or the film quality may vary. It is conceivable that the change of this type in film thickness or in film quality depends on the conditions of the plasma in the chamber.

Incidentally, when the electron beams are irradiated on a plurality of wafers in turn in order to form SOD films on a plurality of wafers, substances generated from the SOD films are attached and piled up on the inner wall of the chamber with the electron-beam irradiation. Accordingly, as the processing of a plurality of wafers proceeds, the condition on the inner wall of the chamber changes when the electron beam is irradiated.

The substances attached on the internal wall of the chamber are gasified and released toward the inside of the chamber. Therefore, the condition of the plasma changes for each wafer. Therefore, the thickness and quality of each SOD film varies for each wafer.

In addition, when the chamber is released in the atmospheric air, moisture in the atmospheric air and the like changes the conditions of the chamber inner wall. Accordingly, when the electron beams are irradiated after the release of the air, plasma different from the plasma at static state is generated and also affects the thicknesses and qualities of the SOD films.

In other words, when an undesired gas exists in the chamber, the gas may be excited by electron beams to change the thicknesses and qualities of the SOD films. Therefore, in Embodiment 1, the inner wall of the chamber 4 is preliminarily coated so that film quality and film thickness for each wafer does not fluctuate due to the condition on the inner wall of the chamber 4.

During the processing in the chamber 4, the gate valve 7 is closed, and the air discharge valve 12 and the gas introduction valve 13 are controlled in such a way that the pressure and the flow rate of the specific gas become desired values. After the processing in the chamber 4 is completed, the gas introduction valve 13 is closed to set the chamber 4 to a vacuum state, the gate valve 7 is opened and the wafer 1 is transported into the transport room 3, and the next wafer is transported into the chamber 4.

FIG. 3 is a process flowchart illustrating a semiconductor device manufacturing process according to Embodiment 1. The process flowchart is based on the assumption that the film formation performed in the chamber 2 has been completed for one lot including a plurality of wafers. In the case where the film formation is performed in the chamber 2, for example, an insulating film is formed by forming with the spin-on method a polyarylene organic film of 100 nm and vaporizing the organic film at a temperature of approximately 200° C. A plurality of wafers 1 (e.g., 25 wafers) on which such films are formed are processed as one lot according to the following procedures.

First of all, when the stage 9 is heated by the heater 10 to a predetermined temperature, a dummy wafer 1 on which a dummy film (referred to as a sacrifice film, hereinafter) has been formed is transported in the chamber 4 to conduct the preliminary coating processing (in Step S1).

FIG. 4 is a flowchart illustrating a detailed procedure for the preliminary coating processing. The dummy wafer 1 is transported into the chamber 4 (in Step S11) and placed on the stage 9 which has been heated by the heater 10 to 300 to 400° C. to perform a baking process (in Step S12). The sacrifice film formed on the dummy wafer 1 is of the same material (e.g., an organic film such as a polyarylene) as that for the original film. It is assumed that the sacrifice film has been preliminarily formed in the chamber 2 with the spin-on method.

Because the stage 9 has been heated by the heater 10, the sacrifice film on the dummy wafer 1 is baked and substances in the sacrifice film are gasified, released, and attached to the inner wall of the chamber 4, whereby the inner wall stabilizes.

Next, while the wafer 1 is kept being baked, electron-beam irradiation onto the sacrifice film, i.e., an EB cure is performed (in Step S13). Due to the electron-beam irradiation, the substances released from the sacrifice film attach to the inner wall of the chamber 4, whereby the inner wall is preliminarily coated. In this case, conditions of the electron-beam irradiation are an acceleration voltage of 10 kV, an atmospheric pressure of 10 Torr, an electron-beam dose of 1.0 mC/cm$^2$, and a processing time of 6 minutes, while introducing Ar gas at a flow rate of 1000 sccm. After the electron-beam irradiation is completed, the dummy wafer 1 is taken out from the chamber 4 (in Step S14).

The preliminary coating on the inner wall of the chamber 4 is performed through the process in Steps S11 to S14. When the preliminary coating is performed, the processing in Step S13 may be omitted. The reason is that it is possible to preliminarily coat the inner wall of the chamber 4 by using the gas from the sacrifice film with only the processing in Step S12.

Basically, it is desirable that the sacrifice film is of the same material as that of the original film. However, in the case where the same material as that of the original film cannot be used, it is desirable that at least part of atoms of the material is the same as part of atoms of the original film. In particular, it is desirable that both the sacrifice film and the original film include carbon as a component. The reason is that carbon is a substance that attaches best to the inner wall of the chamber 4.

After the preliminary coating processing in Step S1 in FIG. 3 is completed, the so-called EB cure processing is performed in which electron beams are irradiated onto wafers 1 for one lot to cause a polymerization reaction (in Step S2).

FIG. 5 is a flowchart illustrating the detailed processing procedure of the EB cure processing in Step S2 in FIG. 3. First of all, an arbitrary wafer 1 in one lot, which has not yet performed the EB cure processing, is transported from the transport room 3 into the chamber 4 (in Step S21). The transported wafer 1 is placed on the stage 9 that has been heated by the heater 10 to 300 to 400° C. A specific film (e.g., a polyarylene film) is preliminarily formed on the wafer 1 with the spin-on method.

Next, the EB cure processing is performed in which electron beams are irradiated onto the wafer 1 to cause a polymerization reaction (in Step S22). The EB-cure conditions are, for example, an acceleration voltage of 10 kV, an atmospheric pressure of 10 Torr, an electron-beam dose of 0.5 mC/cm$^2$, and a processing time of 3 minutes, while introducing Ar gas at a flow rate of 1000 sccm to obtain the desired degree of polymerization.

Because the stage 9 is heated during the EB cure, electron-beam irradiation is performed while performing the baking process. Therefore, compared with the case where the baking process is not performed, the polymerization reaction can be caused in a short time.

Next, the wafer 1 which has performed the EB cure is taken out and transported into the transport room 3 (in Step S23). Then, with regard to all of the wafers 1 for one lot, whether or not the EB cure processing has been performed is determined (in Step S24). When any wafer 1 which has not performed the EB cure processing exists, the process in Steps S21 to S23 is performed.

After the EB cure processing in Step S2 of FIG. 3 is completed, cleaning processing for the chamber 4 is performed (in Step S3). In this case, with the dummy wafer 1 placed on the stage 9 or with nothing placed on the stage 9, electron beams are irradiated onto the stage 9, while oxygen is supplied into the chamber 4. Irradiation of electron beams in the presence of oxygen produces oxygen plasma with which substances that have attached to the inner wall of the chamber 4 can be removed.

Next, standby processing is performed until the next lot is prepared (in Step S4). During the standby processing, the chamber 4 is set again to the vacuum state. In addition, at a state of closing the gate valve 7, the wafers 1 for one lot in the transport room 3 is taken out, the wafers 1 for the next lot are transported into the transport room 3, and then film formation is performed in the chamber 2.

After the film formation for the next lot is completed in the chamber 2, the same processings as those in Steps S1 to S3 are performed. In other words, the preliminary coating processing of the inner wall of the chamber 4, the EB cure processing of the wafers 1 for one lot, and the cleaning processing of the inner wall of the chamber 4 are performed in that order.

As the cleaning processing, instead of the method of generating oxygen plasma like step S3, there is a method of wiping the inner wall of the chamber 4 at a state of releasing the chamber 4 in the atmospheric air. While the processing in FIG. 3 is repeatedly applied to a plurality of lots, the amount of substances that attach to the inner wall of the chamber 4 gradually increases, whereby the inner wall cannot be cleaned with oxygen plasma only. In that case, the air inside the chamber 4 is released in the atmospheric air and the wiping processing is performed.

FIG. 6 is a graph representing a relationship between the number of processed wafers 1 and the film thickness after the EB cure, in the case where the inner wall of the chamber 4 is preliminarily coated and in the case where the inner wall of the chamber 4 is not preliminarily coated. FIG. 6 represents an example in which a polyarylene organic film having a film thickness of 95 nm is formed on the wafer 1. In FIG. 6, the abscissa denotes the wafer number indicating the number of processed wafers 1 and the ordinate denotes the film thickness of the polyarylene film. In FIG. 6, the plot P1 represents a case where the inner wall of the chamber 4 is not preliminarily coated, and the plot P2 represents a case where the inner wall of the chamber 4 is preliminarily coated.

As represented by the plot P1 in FIG. 6, when the inner wall of the chamber 4 is not preliminarily coated, the film thicknesses of the wafers 1 that are processed approximately tenth or later are approximately equal. The film thicknesses of the wafers 1 that are processed first to tenth are significantly different from one another. In contrast, as represented by the plot P2 in FIG. 6, when the inner wall of the chamber 4 is preliminarily coated, the film thicknesses of all the wafers 1 can be made approximately equal. The reason is that the preliminary coating suppresses the conditions of the inner wall of the chamber 4 from differing between the wafers 1 are processed, whereby undesired plasma cannot be formed.

FIG. 7 is a graph representing a relationship between the elapsed time after the chamber 4 is released in the atmospheric air and the film thickness after the EB cure in the case that after the chamber 4 in which the inner wall has been preliminarily coated is released in the atmospheric air, the chamber 4 is set again to the vacuum state, the polyarylene film is formed on the inside of the chamber 4 under the same conditions as those for the graph in FIG. 6, and the EB cure is performed. In FIG. 7, the abscissa denotes the elapsed time after the chamber 4 is set again to the vacuum state, and the ordinate denotes the film thickness of the polyarylene film. In FIG. 7, the plot P3 represents a case where after being exposed to the air, the inner wall of the chamber 4 is not preliminarily coated, and the plot P4 represents a case where after being exposed to the air, the inner wall of the chamber 4 is preliminarily coated.

When the inner wall of the chamber 4 is exposed to the air, moisture ($H_2O$) adheres to the inner wall of the chamber 4. When performing electron-beam irradiation, the hydrogen included in the moisture is transformed into plasma and disconnects atomic combinations in the film formed on the wafer 1, thereby changing the film quality and the film thickness. Even though the chamber 4 is set again to the vacuum state after the air inside the chamber 4 is released, the moisture remains for some time on the inner wall of the chamber 4. Therefore, the film thickness significantly changes, as represented by the plot P3 in FIG. 7. Then, the reason why the film thickness stabilizes is that the moisture that has adhered to the inner wall of the chamber 4 is gradually discharged from the inside of the chamber 4, whereby the occurrence of the hydrogen plasma is suppressed.

In contrast, as represented by the plot P4 in FIG. 7, in the case where the inner wall of the chamber 4 is preliminarily coated, the film thicknesses of the wafers 1 can be made approximately equal, regardless of the elapsed time after the air inside the chamber 4 has been released. That reason is that the moisture which is introduced from the outside of the chamber 4 when the inner wall of the chamber 4 is exposed to the air is covered with the preliminary coating, whereby the occurrence of the hydrogen plasma is suppressed.

Although the film-thickness properties have been illustrated in FIGS. 6 and 7 described above, FIGS. 8 and 9 illustrate properties of the film quality.

Figure 8:
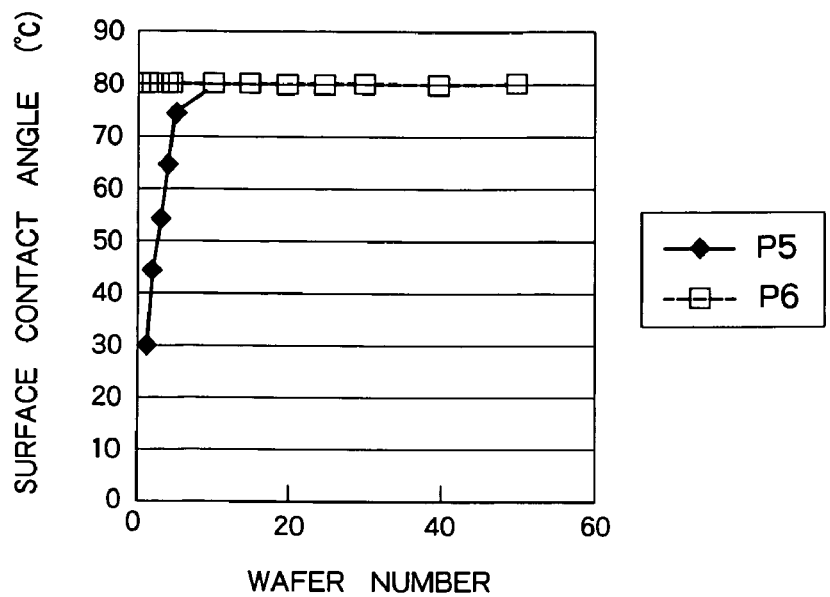
FIG. 8 is a graph representing the relationship between the number of processed wafers 1 and the surface contact angle after the EB cure, in the case where the inner wall of the chamber 4 is preliminarily coated and in the case where the inner wall of the chamber 4 is not preliminarily coated.

FIG. 8 is a graph showing a relationship between the number of processed wafers 1 and the surface contact angle after the EB cure with regard to an organic silicon oxide film formed on the wafer 1 in the case where the inner wall of the chamber 4 is preliminarily coated and in the case where the inner wall of the chamber 4 is not preliminarily coated. In FIG. 8, the plots P5 and P6 represent a case where the inner wall of the chamber 4 is not preliminarily coated and a case where the inner wall of the chamber 4 is preliminarily coated, respectively. As illustrated in FIG. 8, in the case where the inner wall of the chamber 4 is preliminarily coated, the surface contact angles of all of the wafers 1 become approximately equal to one another and the fluctuation of the film quality on the film surface becomes small, thereby improving the film quality.

Figure 9:
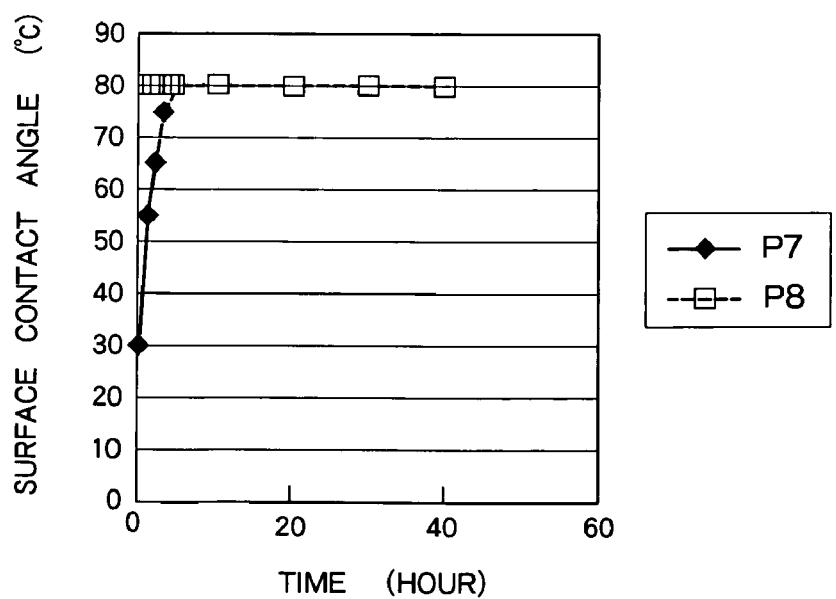
FIG. 9 is a graph representing a relationship between the elapsed time after the chamber 4 has been released in the atmospheric air and the surface contact angle after the EB cure in the case where the inner wall of the chamber 4 is preliminarily coated after the chamber 4 is released in the atmospheric air, and then the chamber 4 is set again to the vacuum state and in the case where the inner wall of the chamber 4 is not preliminarily coated.

FIG. 9 is a graph representing a relationship between the elapsed time after the chamber 4 has been released in the atmospheric air and the surface contact angle after the EB cure in the case where the chamber 4 in which the inner wall is preliminarily coated, and then the chamber 4 is exposed to the air, and then chamber 4 is set again to the vacuum state, and then an organic silicon oxide film is formed on the inside of the chamber 4 under the same conditions as those for the graph in FIG. 8 to perform the EB cure. In FIG. 9, the plots P7 and P8 represent a case where after being exposed to the air, the inner wall of the chamber 4 is not preliminarily coated and a case where after being exposed to the air, the inner wall of the chamber 4 is preliminarily coated, respectively. Also in FIG. 9, by preliminarily coating the inner wall of the chamber 4, the surface contact angles of all of the wafers 1 become approximately equal to one another, regardless of the elapsed time after the air has been released, and the fluctuation of the film quality on the film surface becomes small, thereby improving the film quality.

As described above, in Embodiment 1, before the EB cure is applied to a film formed with spin-on method on a wafer, the inner wall of the chamber 4 is preliminarily coated with the sacrifice film. Therefore, when the EB cure is performed, the conditions of the inner wall of the chamber 4 do not differ each time the wafers 1 are processed, and there is no likelihood that undesirable substances are emitted from the inner wall of the chamber 4. Therefore, it is possible to equalize and stabilize the film quality and the film thickness on the wafers 1.

Embodiment 2

In Embodiment 1, the example in which the inner wall of the chamber 4 is cleaned for one lot has been described. However, when the attached amount on the inner wall of the chamber 4 is not large with the processing for only one lot, the cleaning of the inner wall may be performed for every several lots.

Figure 10:
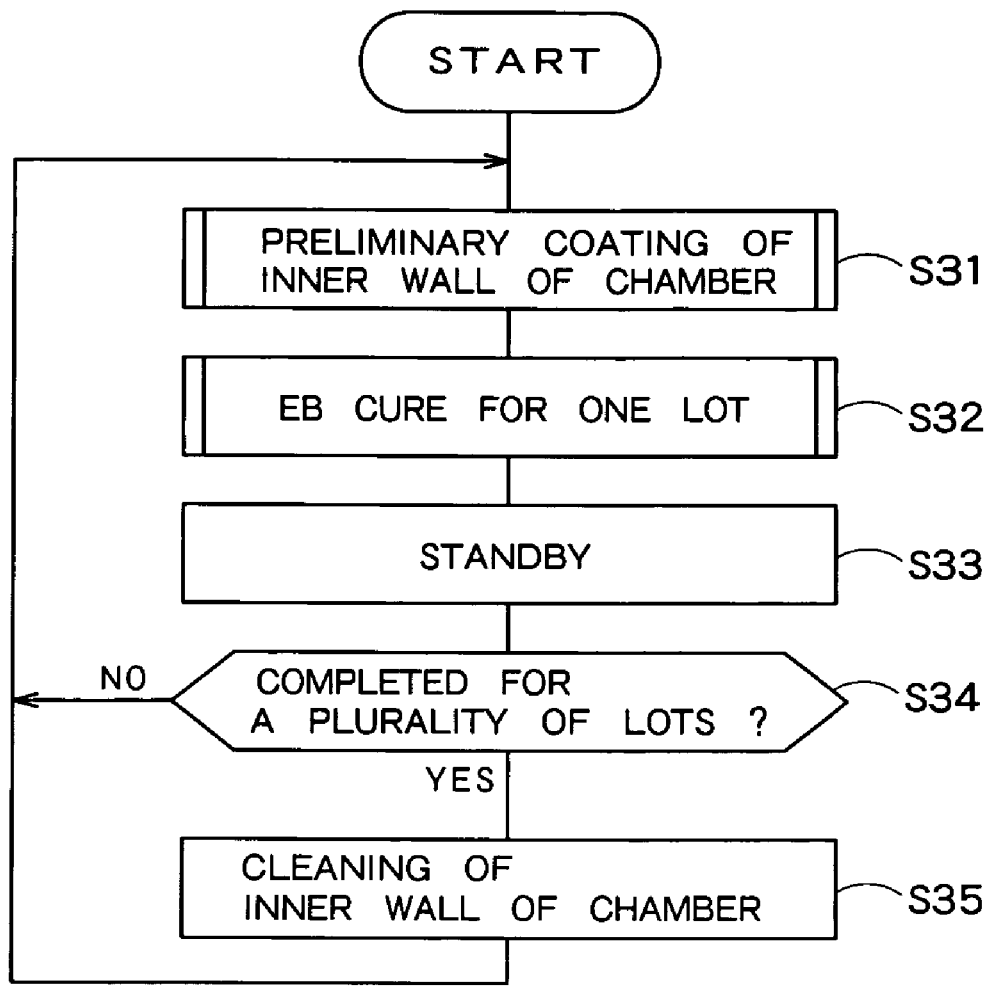
FIG. 10 is a process flowchart illustrating a semiconductor device manufacturing process according to Embodiment 2 of the present invention.

FIG. 10 is a process flowchart illustrating a semiconductor device manufacturing process according to Embodiment 2. In Embodiment 2, after the preliminary coating processing (in Step S31) of the inner wall of the chamber 4 and the EB cure processing (in Step S32) for one lot of wafers 1, the standby processing (in Step S3) of the inner wall of the chamber 4 are performed for the next lot.

Then, whether or not the EB cure processing of a predetermined multiple lots has been completed is determined (in Step S34). If the EB cure processing of the predetermined multiple lots has not been completed, the process returns to Step S31 to perform the processing in Steps S31 to S33. If the EB cure processing of the predetermined multiple lots has been completed, the cleaning processing of the inner wall of the chamber 4 is performed (in Step S35), and step S31 and the subsequent processings are repeated.

As is the case with Step S3 in FIG. 3, the cleaning processing in Step S35 may be a method in which oxygen plasma is generated to perform cleaning or a method in which the inner wall of the chamber 4 is wiped at a state of releasing the chamber 4 in the atmospheric air.

As described above, in Embodiment 2, after the EB cure for a plurality of lots is performed, cleaning processing is performed. Therefore, compared with Embodiment 1, the number of cleaning processing steps can be reduced, whereby the total processing time can be shortened.

In addition, in Embodiments 1 and 2 described above, a case has been explained in which a film is formed with a method of dripping a liquid-state substance while the stage 5 is rotated, i.e., the spin-on method. However, the film may be formed with a CVD (Chemical Vapor Deposition) apparatus.

What is claimed is:

1. A method of manufacturing a semiconductor device, comprising:
   baking a first semiconductor substrate on which a sacrifice film is formed in a reaction chamber to preliminarily coat an inner wall of the reaction chamber with a component of a gas generated by the sacrifice film; and
   baking a second semiconductor substrate on which a predetermined film including the same component as that of the sacrifice film is formed in the preliminarily coated reaction chamber, while irradiating electron beams on the predetermined film to change quality of the predetermined film.

2. The method according to claim 1,
   wherein the sacrifice film and the predetermined film are organic films.

3. The method according to claim 1,
   wherein the predetermined film on the second semiconductor substrate is formed by spin-on or CVD in a different chamber before being transported to the reaction chamber.

4. The method according to claim 1,
   wherein while the first semiconductor substrate is baked in the reaction chamber, the electron beams are irradiated on the sacrifice film to preliminarily coat the inner wall of the reaction chamber.

5. The method according to claim 4,
   wherein the first and second semiconductor substrates are transported to the reaction chamber and mounted on a stage to perform the processings of baking the substrates and irradiating electron beams on the substrates when the stage in the reaction chamber becomes a predetermined temperature.

6. The method according to claim 1, further comprising:
   performing a cleaning processing of the inner wall of the reaction chamber before preliminarily coating the inner wall of the reaction chamber.

7. The method according to claim 6, wherein the processings of baking the second semiconductor substrates and irradiating electron beams on the second semiconductor substrates are performed in units of one lot including a plurality of second semiconductor substrate;

every time the processings of baking the second semiconductor substrates and irradiating electron beams on the second semiconductor substrates are completed for one lot, the cleaning processing is performed, and then the inner wall of the reaction chamber is preliminarily coated by using the first semiconductor substrate, and then the processings of baking the second semiconductor substrates and irradiating electron beams on the second semiconductor substrates are performed for the next lot.

8. The method according to claim 7, wherein every time the processings of baking the second semiconductor substrates and irradiating electron beams on the second semiconductor substrates are completed for one lot, as the cleaning processing, at a state of providing oxygen in the reaction chamber, electron beams are irradiated toward a stage in the reaction chamber to generate plasma of oxygen, and every time the processings of baking the second semiconductor substrates and irradiating electron beams on the second semiconductor substrates are completed for multiple lots, a processing of wiping the inner wall of the reaction chamber is performed as the cleaning processing.

9. The method according to claim 6, wherein the processings of baking the second semiconductor substrates and irradiating electron beams on the second semiconductor substrates are performed in units of one lot including a plurality of second semiconductor substrate;

every time the processings of baking the second semiconductor substrates and irradiating electron beams on the second semiconductor substrates are completed for multiple lots, the cleaning processing is performed, and then the inner wall of the reaction chamber is preliminarily coated by using the first semiconductor substrate, and then the processings of baking the second semiconductor substrate and irradiating electron beams on the second semiconductor substrates are performed for the next multiple lots.

10. The method according to claim 9, wherein the processing of preliminarily coating the inner wall of the reaction chamber is performed every time the processings of baking the second semiconductor substrates and irradiating electron beams on the second semiconductor substrates are completed for one lot, and then the processings of baking the second semiconductor substrates and irradiating electron beams on the second semiconductor substrates are performed for the next lot.

11. The method according to claim 6, wherein the cleaning processing is a processing of irradiating electron beams toward a stage in the reaction chamber to generate plasma of oxygen at a state of providing oxygen in the reaction chamber.

12. The method according to claim 6, wherein the cleaning processing is a processing of wiping the inner wall of the reaction chamber.

13. The method according to claim 1, wherein the processing of preliminarily coating the inner wall of the reaction chamber is performed after at least the reaction chamber is exposed in the air.

14. The method according to claim 13, wherein the processing of preliminarily coating the inner wall of the reaction chamber causes to cover moisture attached on the inner wall of the reaction chamber by exposing the reaction chamber in the air.

15. The method according to claim 1, wherein at least part of atoms included in a material constituting the sacrifice film is the same as at least part of atoms included in a material constituting the predetermined film.

16. The method according to claim 15, wherein the sacrifice film and the predetermined film include carbon.

17. The method according to claim 1, wherein the predetermined film is a film which causes a polymerism reaction by irradiation of electron beams.

18. The method according to claim 17, wherein the predetermined film is a spin-on dielectric film.

19. The method according to claim 18, wherein the spin-on dielectric film is a polyarylene film.

20. The method according to claim 18, wherein the spin-on dielectric film is an organic silicon oxide film.

* * * * *